United States Patent
Chopra et al.

(12) 
(10) Patent No.: US 6,313,038 B1
(45) Date of Patent: Nov. 6, 2001

(54) METHOD AND APPARATUS FOR CONTROLLING CHEMICAL INTERACTIONS DURING PLANARIZATION OF MICROELECTRONIC SUBSTRATES

(75) Inventors: Dinesh Chopra; Scott G. Meikle, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/558,807

(22) Filed: Apr. 26, 2000

(51) Int. Cl.[7] .................................................. H01L 21/00
(52) U.S. Cl. ........................... 438/692; 216/38; 216/88; 216/89; 438/693; 438/745
(58) Field of Search ...................... 156/345 LP; 438/691, 438/692, 693, 745; 216/38, 88, 89

(56) References Cited

U.S. PATENT DOCUMENTS

| 5,614,444 | * | 3/1997 | Farkas et al. ...................... | 216/89 X |
| 6,040,245 | * | 3/2000 | Sandhu et al. ..................... | 438/693 X |
| 6,169,033 | * | 1/2001 | Marshall ........................... | 438/693 X |

OTHER PUBLICATIONS

Kosmulski, Michal. "About zeta potential." Jul. 18, 1999. http://hermes.umcs.lublin.pl/users/kosmulsk/michal/zetapo.htm (Jun. 7, 2000).
"About Brookhaven Instruments Corporation." http://www.bic.com/aboutbic.com.htm (Jun. 6, 2000).
"Zeta Potential and Stability." http://www.bic.com/z theoryl.com.htm (Jun. 7, 2000).
"When Zeta Potential is Important." http://www.bic.com/morezeta.htm (Jun. 7, 2000).
"Characterising and Controlling High Solid Suspensions Using Zeta Potential." http://www.ceram.co.uk/ptp/1996_{13}projects/jmichaelp.htm (Jun. 7, 2000).
"An introduction to zeta potential." http://reliant.pharm.nottingham.ac.uk/zeta.html (Jun. 7, 2000).
"Why are interfaces charged?" http://reliant.pharm.nottingham.ac.uk/charge.html (Jun. 7, 2000).
"Zeta potential and electrolytes." http://reliant.pharm.nottingham.ac.uk/elect.html (Jun. 7, 2000).
"Measurement of Zeta Potential." http://reliant.pharm.nottingham.ac.uk/meas.html (Jun. 7, 2000).
"Planning your zeta potential experiment." http://reliant.pharm.nottingham.ac.uk/plan.html (Jun. 7, 2000).
"Operating procedure for the Zetasizer." http://reliant.pharm.nottingham.ac.uk/use.html (Jun. 7, 2000).

* cited by examiner

Primary Examiner—William A. Powell
(74) Attorney, Agent, or Firm—Perkins Coie LLP

(57) ABSTRACT

A method and apparatus for planarizing a microelectronic substrate. In one embodiment, the microelectronic substrate is engaged with a planarizing medium that includes a planarizing pad and a planarizing liquid, at least one of which includes a chemical agent that removes a corrosion-inhibiting agent from discrete elements (such as abrasive particles) of the planarizing medium and/or impedes the corrosion-inhibiting agent from coupling to the discrete elements. The chemical agent can act directly on the corrosion-inhibiting agent or can first react with a constituent of the planarizing liquid to form an altered chemical agent, which then interacts with the corrosion-inhibiting agent. Alternatively, the altered chemical agent can control other aspects of the manner by which material is removed from the microelectronic substrate, for example, the material removal rate.

66 Claims, 3 Drawing Sheets

METHOD AND APPARATUS FOR CONTROLLING CHEMICAL INTERACTIONS DURING PLANARIZATION OF MICROELECTRONIC SUBSTRATES

TECHNICAL FIELD

This invention relates to methods and apparatuses for controlling chemical interactions during planarization of microelectronic substrates, for example, controlling the interactions of a corrosion-inhibiting agent.

BACKGROUND

Mechanical and chemical-mechanical planarization processes (collectively "CMP") are used in the manufacturing of electronic devices for forming a flat surface on semiconductor wafers, field emission displays and many other microelectronic-device substrate assemblies. CMP processes generally remove material from a substrate assembly to create a highly planar surface at a precise elevation in the layers of material on the substrate assembly. FIG. 1 schematically illustrates an existing web-format planarizing machine 10 for planarizing a substrate 12. The planarizing machine 10 has a support table 14 with a top-panel 16 at a workstation where an operative portion "A" of a planarizing pad 40 is positioned. The top-panel 16 is generally a rigid plate to provide a flat, solid surface to which a particular section of the planarizing pad 40 may be secured during planarization.

The planarizing machine 10 also has a plurality of rollers to guide, position and hold the planarizing pad 40 over the top-panel 16. The rollers include a supply roller 20, first and second idler rollers 21a and 21b, first and second guide rollers 22a and 22b, and take-up roller 23. The supply roller 20 carries an unused or pre-operative portion of the planarizing pad 40, and the take-up roller 23 carries a used or post-operative portion of the planarizing pad 40. Additionally, the first idler roller 21a and the first guide roller 22a stretch the planarizing pad 40 over the top-panel 16 to hold the planarizing pad 40 stationary during operation. A motor (not shown) drives at least one of the supply roller 20 and the take-up roller 23 to sequentially advance the planarizing pad 40 across the top-panel 16. Accordingly, clean pre-operative sections of the planarizing pad 40 may be quickly substituted for used sections to provide a consistent surface for planarizing and/or cleaning the substrate 12.

The web-format planarizing machine 10 also has a carrier assembly 30 that controls and protects the substrate 12 during planarization. The carrier assembly 30 generally has a substrate holder 32 to pick up, hold and release the substrate 12 at appropriate stages of the planarizing process. Several nozzles 33 attached to the substrate holder 32 dispense a planarizing solution 44 onto a planarizing surface 42 of the planarizing pad 40. The carrier assembly 30 also generally has a support gantry 34 carrying a drive assembly 35 that can translate along the gantry 34. The drive assembly 35 generally has an actuator 36, a drive shaft 37 coupled to the actuator 36, and an arm 38 projecting from the drive shaft 37. The arm 38 carries the substrate holder 32 via a terminal shaft 39 such that the drive assembly 35 orbits the substrate holder 32 about an axis B—B (as indicated by arrow "$R_1$"). The terminal shaft 39 may also rotate the substrate holder 32 about its central axis C—C (as indicated by arrow "$R_2$").

The planarizing pad 40 and the planarizing solution 44 define a planarizing medium that mechanically and/or chemically-mechanically removes material from the surface of the substrate 12. The planarizing pad 40 used in the web-format planarizing machine 10 is typically a fixed-abrasive planarizing pad in which abrasive particles are fixedly bonded to a suspension material. In fixed-abrasive applications, the planarizing solution is a "clean solution" without abrasive particles because the abrasive particles are fixedly distributed across the planarizing surface 42 of the planarizing pad 40. In other applications, the planarizing pad 40 may be a non-abrasive pad without abrasive particles. The planarizing solutions 44 used with the non-abrasive planarizing pads are typically CMP slurries with abrasive particles and chemicals to remove material from a substrate.

To planarize the substrate 12 with the planarizing machine 10, the carrier assembly 30 presses the substrate 12 against the planarizing surface 42 of the planarizing pad 40 in the presence of the planarizing solution 44. The drive assembly 35 then orbits the substrate holder 32 about the axis B-B and optionally rotates the substrate holder 32 about the axis C—C to translate the substrate 12 across the planarizing surface 42. As a result, the abrasive particles and/or the chemicals in the planarizing medium remove material from the surface of the substrate 12.

The CMP processes should consistently and accurately produce a uniformly planar surface on the substrate assembly to enable precise fabrication of circuits and photo-patterns. During the fabrication of transistors, contacts, interconnects and other features, many substrate assemblies develop large "step heights" that create a highly topographic surface across the substrate assembly. Yet, as the density of integrated circuits increases, it is necessary to have a planar substrate surface at several intermediate stages during substrate assembly processing because non-uniform substrate surfaces significantly increase the difficulty of forming sub-micron features. For example, it is difficult to accurately focus photo patterns to within tolerances approaching 0.1 micron on non-uniform substrate surfaces because sub-micron photolithographic equipment generally has a very limited depth of field. Thus, CMP processes are often used to transform a topographical substrate surface into a highly uniform, planar substrate surface.

In some conventional CMP processes, the planarizing pad 40 engages a metal portion of the substrate 12 having a highly topographical surface with high regions and low regions. The planarizing liquid 44 can include solvents or other agents that chemically oxidize and/or etch the metal to increase the removal rate of the metal during planarization. During the planarizing process, the beneficial accelerating effect of the etchant can be reduced because the etchant can act at least as quickly on the low regions of the metal portion as the high regions of the metal portion. Accordingly, the low regions may recede from the high regions and reduce the planarity of the substrate 12.

One approach addressing this potential drawback is to dispose a corrosion-inhibiting agent in the planarizing liquid 44 to restrict or halt the action of the etchant. This allows the mechanical interaction between the planarizing pad 40 and the substrate 12 to dominate the chemical interaction. Accordingly, the removal rate at the high regions of the microelectronic substrate 12 is generally higher than the low regions because the high regions have more mechanical contact with the planarizing pad 40 than do the low regions. As a result, the height differences between the high regions and the low regions are more quickly reduced. The inhibiting agent, however, can have adverse effects on the overall removal rate and other aspects of the planarizing process.

SUMMARY OF THE INVENTION

The present invention is directed toward methods and apparatuses for planarizing microelectronic substrates. A method in accordance with one aspect of the invention includes engaging the microelectronic substrate with a planarizing medium having a planarizing liquid and a planarizing pad with a planarizing surface, with at least one of the planarizing liquid and the planarizing pad having a selected chemical agent. The method firther includes separating a passivating agent (such as a corrosion-inhibiting agent) from a discrete element (such as an abrasive particle) of the planarizing medium with the selected chemical agent and/or impeding the corrosion-inhibiting agent from coupling to the discrete element of the planarizing medium with the selected chemical agent. The method still further includes moving at least one of the planarizing pad and the microelectronic substrate relative to the other to remove material from the microelectronic substrate.

In another aspect of the invention, the selected chemical agent can dissolve the corrosion-inhibiting agent or break the corrosion-inhibiting agent into constituents that dissolve in the planarizing liquid. The selected chemical agent can interact directly with the corrosion-inhibiting agent, or it can first react with at least one constituent of the planarizing liquid to form an altered chemical agent which then reacts with the corrosion-inhibiting agent.

In still another aspect of the invention, the selected chemical agent can control a rate and/or manner of material removal from the microelectronic substrate after reacting with a constituent of the planarizing liquid to form a second chemical agent. For example, the second chemical agent can restrict an amount of a corrosion-inhibiting agent chemically interacting with the planarizing pad, or the second chemical agent can include an etchant to accelerate a removal rate of material from the microelectronic substrate.

The present invention is also directed toward a planarizing medium for planarizing a microelectronic substrate. In one aspect of the invention, the planarizing medium can include a planarizing pad having a planarizing surface configured to engage the microelectronic substrate, and a planarizing liquid adjacent to the planarizing pad. At least one of the planarizing pad the planarizing liquid includes a chemical agent selected to separate a passivating agent (such as a corrosion-inhibiting agent) from discrete elements of the planarizing medium and/or inhibit the corrosion-inhibiting agent from attaching to the discrete elements_ during planarization of the microelectronic substrate. In one aspect of this invention, the chemical agent can be selected to react with a constituent of the planarizing liquid to form an altered chemical agent that restricts interaction between the corrosion-inhibiting agent and the planarizing pad. Alternatively, the altered chemical agent can be selected to control other aspects of material removal from the microelectronic substrate.

DETAILED DESCRIPTION

The present disclosure describes planarizing media and methods for using planarizing media for chemical and/or chemical-mechanical planarizing of substrates and substrate assemblies used in the fabrication of microelectronic devices. Many specific details of certain embodiments of the invention are set forth in the following description and in FIGS. 2–4 to provide a thorough understanding of these embodiments. One skilled in the art, however, will understand that the present invention may have additional embodiments, or that the invention may be practiced without several of the details described below.

Figure 1:
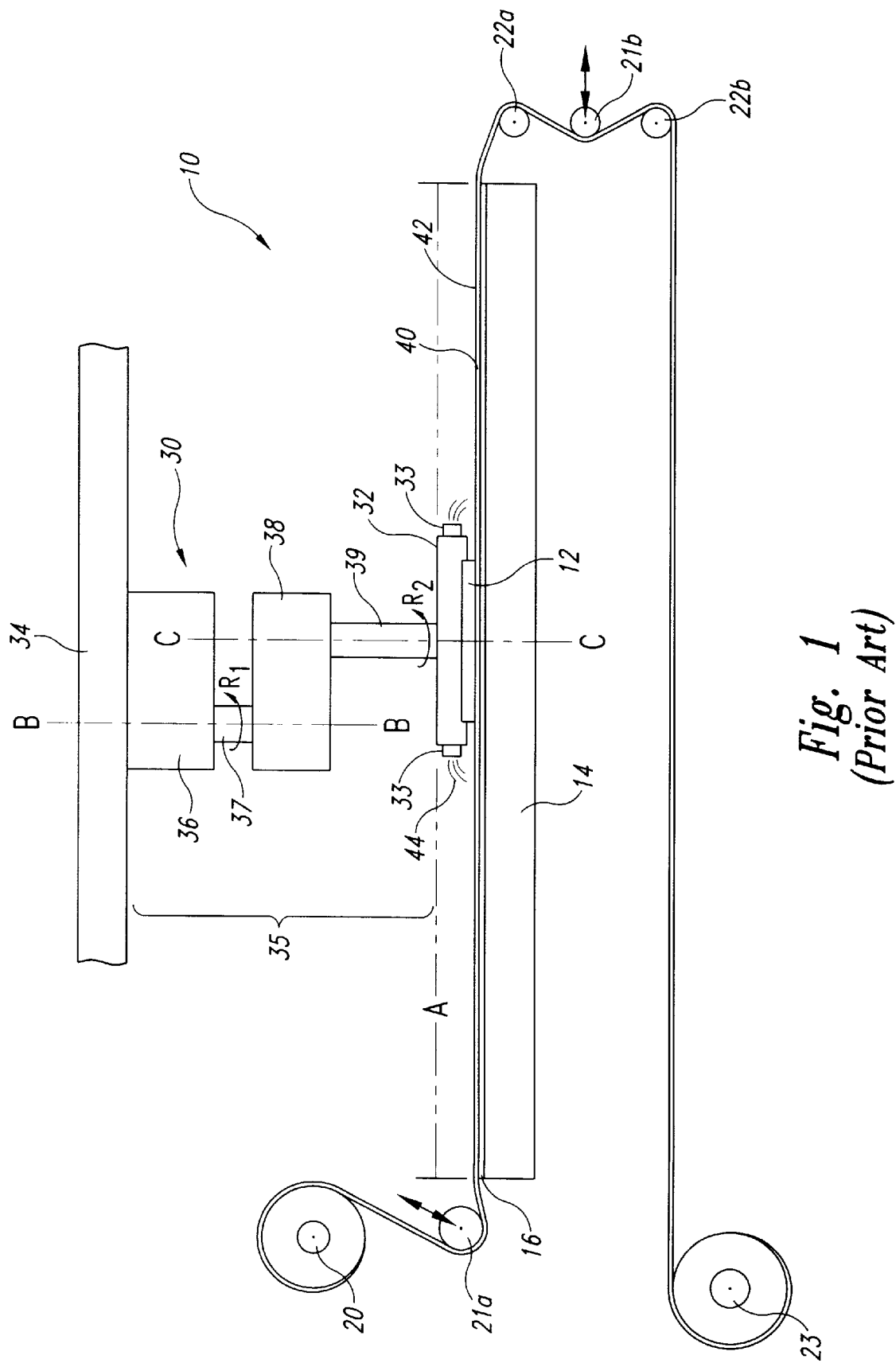
FIG. 1 is a partially schematic side elevational view of a planarizing apparatus in accordance with the prior art.
Figure 2:
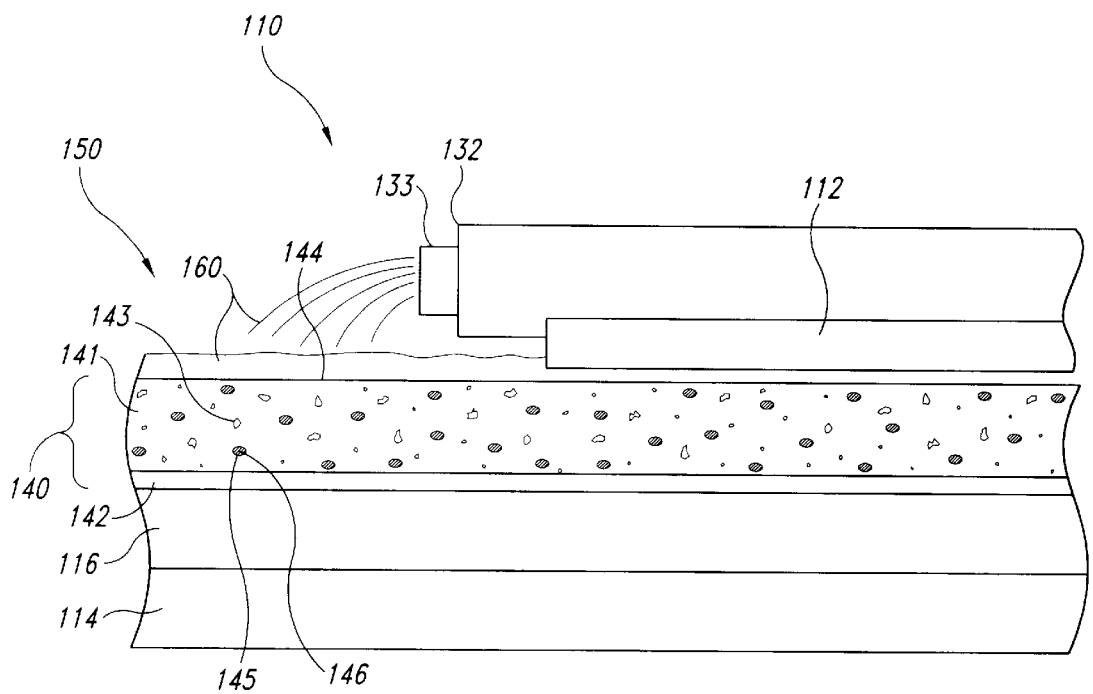
FIG. 2 is a schematic side elevational view partially illustrating a planarizing pad having embedded abrasive elements and an embedded reactive chemical agent in accordance with an embodiment of the invention.

FIG. 2 is a schematic side elevational view illustrating a portion of a CMP machine 110 having a planarizing medium 150 in accordance with an embodiment of the invention. The planarizing medium 150 can include a planarizing pad 140 and a planarizing liquid 160 disposed on the planarizing pad 140. The planarizing machine 110 includes a support table 114 and a top-panel 116 that support the planarizing medium 150 in a manner generally similar to that discussed above with reference to FIG. 1. The planarizing machine 110 further includes a substrate holder 132 that supports a microelectronic substrate 112, also in a manner generally similar to that discussed above with reference to FIG. 1. As used herein, the term microelectronic substrate refers to a microelectronic substrate material with or without an assembly of microelectronic devices or features.

In one embodiment, the planarizing liquid 160 is dispensed onto the planarizing pad 140 from a port 133 in the substrate holder 132. Alternatively, the planarizing liquid 160 can be directed to the planarizing pad 140 from other sources, such as a conduit (not shown) positioned near the planarizing pad 140. In either embodiment, the planarizing liquid 160 can include one or more chemicals that control the removal rate and manner that material is removed from the microelectronic substrate 112 during planarization. For example, the planarizing liquid 160 can include an etchant for etching the microelectronic substrate 112 and/or a passivating agent, such as a corrosion-inhibiting agent to prevent or restrict corrosion or etching during selected phases of the planarization process. In one aspect of this embodiment, the microelectronic substrate 112 can include a copper layer or copper components, and the planarizing liquid 160 can include benzoltriazole to inhibit etching of the copper at selected phases of the CMP process. Alternatively, the planarizing liquid 160 and/or the planarizing pad 140 can include other chemicals that inhibit chemical interaction between the planarizing medium 150 and the microelectronic substrate 112.

The planarizing pad 140 can include a pad body 141 and a backing layer 142 that supports the pad body 141. The pad body 141 can include polycarbonates, resins, acrylics, polymers (such as polyurethane) or other suitable materials. In one embodiment, a plurality of abrasive elements 143 are distributed in the planarizing pad body 141 proximate to a planarizing surface 144 of the planarizing pad 140. As the planarizing pad 140 wears down during planarization, new abrasive elements 143 are exposed at the planarizing surface 144 to maintain or control the abrasive characteristics of the planarizing pad 140 throughout the planarization process. The abrasive elements 143 can include alumina, ceria, titania or other suitable abrasive materials that mechanically and/or chemically-mechanically remove material from the microelectronic substrate 112.

During planarization, the performance of the abrasive elements 143 can be impaired by the chemicals in the planarizing solution. For example, benzoltriazole or other inhibiting agents can attach to the surfaces of the abrasive elements 143 and reduce the chemical and/or mechanical interactions between the abrasive elements 143 and the microelectronic substrate 112. Accordingly, in one embodiment, the planarizing medium 150 includes a chemical agent 146 that reduces or eliminates the effect of inhibiting agents on the abrasive elements 143. In one aspect of this embodiment, the chemical agent 146 is embedded in the planarizing pad body 141 and is released into the planarizing liquid 160 as the planarizing pad 140 wears down. In another aspect of this embodiment, the chemical agent 146 is selected to undergo a chemical reaction with the planarizing liquid 160 or a constituent of the planarizing liquid 160 to form an altered chemical agent. The altered chemical agent then slows or halts the extent to which the inhibiting agent restricts the chemical and/or mechanical interaction between the abrasive elements 143 and the microelectronic substrate 112. For example, the chemical agent 146 can be selected to form a solvent or etchant that removes the inhibiting agent from the abrasive elements 143 and/or prevents the inhibiting agent from attaching, coupling and/or chemically interacting with the abrasive elements 143.

In one embodiment, the chemical agent 146 can include phosphorus, chlorine, nitrogen, sulfur or compounds that include these elements. Accordingly, the chemical agent can form an altered chemical agent that includes phosphoric acid, hydrochloric acid, nitric acid, or sulfuric acid, respectively, upon chemically reacting with the planarizing liquid 160. Alternatively, the chemical agent 146 can include other compounds or elements that react what the planarizing liquid 160 to form other chemicals that restrict or prevent interaction between the abrasive elements 143 and inhibiting agents.

In one aspect of the foregoing embodiments, the altered chemical agent can dissolve the inhibiting agent. Alternatively, the altered chemical agent can react with the inhibiting agent to form a compound that is more soluble in the planarizing liquid 160 than is the inhibiting agent alone. Accordingly, the inhibiting agent will be more likely to dissolve in the planarizing liquid 160. In another alternate embodiment, the altered chemical agent can break down the inhibiting agent into constituents that are more soluble in the planarizing liquid 160 than is the inhibiting agent alone. In still further embodiments, the altered chemical agent can undergo other reactions or interactions with the inhibiting agent that at least restrict the chemical interaction between the inhibiting agent and the abrasive elements 143.

In another embodiment, the chemical agent 146 can react directly with the inhibiting agent without first reacting with the planarizing liquid 160. For example, the chemical agent 146 can include solvents, such as the acidic compounds discussed above, or other suitable compounds that dissolve the inhibiting agent or otherwise limit the ability of the inhibiting agent to impair the effectiveness of the abrasive elements 143.

Whether the chemical agent 146 reacts directly with the inhibiting agent or first reacts with the planarizing liquid 160 to form an altered chemical agent that reacts with the inhibiting agent, the chemical agent 146 can be embedded in the planarizing pad body 141. In one embodiment, solid granules of the chemical agent 146 are dispersed in a liquid or soft planarizing pad material, and then the planarizing pad material is cured to solidify around the chemical agent 146 and form discrete cells 145 around the chemical agent 146. For example, the chemical agent 146 can be distributed in the planarizing pad body 141 in a manner generally similar to that with which the abrasive elements 143 are distributed. Alternatively, the discrete cells 145 can be preformed in the planarizing pad body 141 and then filled with the chemical agent 146. In this alternate embodiment, the chemical agent 146 can be in a liquid, gel, or solid phase. In either of the above methods for distributing the chemical agent 146 in the planarizing body 141, the size, shape and distribution of the cells 145 within the planarizing pad body 141 can be selected to reduce the impact of the chemical agent 146 on the abrasive characteristics of the planarizing pad body. For example, the cells 145 can be small and uniformly distributed in the planarizing pad body 141 so as not to interfere with the distribution and/or operation of the abrasive elements 143. In one aspect of this embodiment, the cells 145 are randomly distributed and are from about 50% to about 100% the size of the abrasive elements 143. Alternatively, the cells 145 can be larger or smaller, so long as they do not interfere with the abrasive elements 143. The cells 145 can have a generally elliptical shape in one embodiment and can have other shapes in other embodiments.

In an embodiment in accordance with another aspect of the invention, the pH of the planarizing liquid 160 can be controlled to selected levels that are believed to reduce the chemical interaction between the inhibiting agent and the abrasive elements 143. For example, in one aspect of this embodiment, the abrasive elements 143 have a first zeta potential and the microelectronic substrate 112 includes a metal or other constituent having a second zeta potential. As used herein, the zeta potential refers to the potential of a surface in a particular planarizing medium. For example, when the planarizing liquid 160 includes an inhibiting agent, the agent typically includes negatively charged ions. Accordingly, the pH of the planarizing fluid 160 can be selected so that the abrasive elements 143 have a zeta potential similar (i.e., of the same polarity) to that of the inhibiting agent so that they repel. This can prevent chemical interaction between the inhibiting agent and the planarizing pad 140. In one aspect of this embodiment, for example, when the abrasive elements 143 include alumina and the microelectronic substrate 112 includes copper, the planarizing liquid 160 has a pH from about 6 to about 10. In a particular aspect of this embodiment, the planarizing liquid 160 has a pH of about 7 and in other embodiments, the planarizing liquid has a pH of other values.

One feature of an embodiment of the planarizing medium 150 discussed above with reference to FIG. 2 is that the planarizing pad 140 includes a chemical agent 146 that at least limits the chemical interaction between the inhibiting agent in the planarizing liquid 160 and the abrasive elements 143 in the planarizing pad 140. The chemical agent 146 may also limit, to a lesser degree, the interaction between the inhibiting agent and the microelectronic substrate 112, but the primary effect of the chemical agent 146 is generally to limit the chemical interaction between the inhibiting agent and the abrasive elements 143. An advantage of this feature is that the surfaces of the abrasive elements 143 can remain chemically active to planarize the microelectronic substrate 112. This is unlike some conventional techniques for which the inhibiting agent can restrict the effectiveness of the abrasive elements 143.

Another advantage of an embodiment of the planarizing medium 150 is that the chemical agent 146 remains embedded in the planarizing pad 140 until the planarizing pad 140 wears down sufficiently to release the chemical agent 146. Accordingly, the amount of the chemical agent 146 released into the planarizing liquid 160 can be controlled by controlling the concentration and the distribution of the chemical agent 146 in the planarizing pad 140 and the rate with which the planarizing pad 140 abrades during planarization.

In another embodiment, the chemical agent 146 (released as the planarizing pad 140 abrades during planarization) interacts with the planarizing liquid 160 to form compounds that control other aspects of the planarizing process. For example, the chemical agent 146 can react with the planarizing liquid 160 to form a solvent or etchant that removes material from the microelectronic substrate 112. In one aspect of this embodiment, the chemical agent 146 can include nitrogen or a nitrogen compound (such as potassium nitrate) that forms nitric acid when exposed to the planarizing liquid 160. The nitric acid can directly etch copper or other metals from the microelectronic substrate 112, to increase the planarizing rate of the microelectronic substrate when the metals are exposed. In other embodiments, the chemical agent 146 can react with the planarizing liquid 160 to form other chemical compounds. For example, the chemical agent 146 can form a surfactant that increases the wetted surface area of the planarizing pad 140 and/or the microelectronic substrate 112 to increase the speed and uniformity of the planarizing process. In still further embodiments, the chemical agent 146 can form other chemical elements or compounds that control the rate and/or the manner of material removal from the microelectronic substrate 112.

Figure 3:
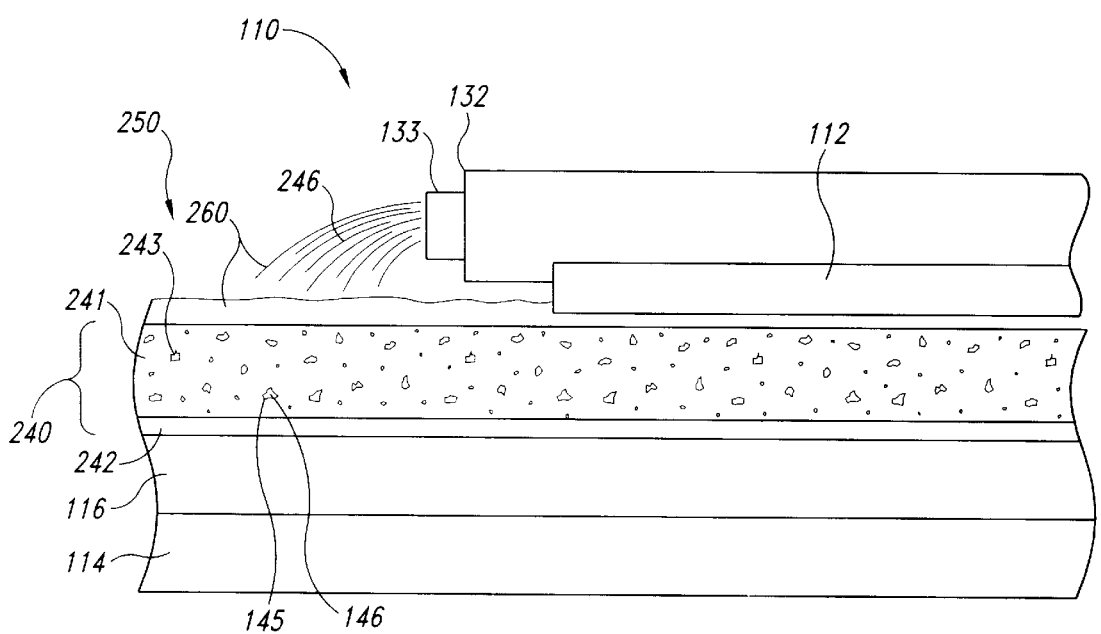
FIG. 3 is a schematic side elevational view partially illustrating a planarizing pad supporting a planarizing liquid that includes a reactive chemical agent.

FIG. 3 is a schematic side elevational view partially illustrating the planarizing machine 110 discussed above with reference to FIG. 2 supporting a planarizing medium 250 that includes a planarizing pad 240 and a planarizing liquid 260 in accordance with another embodiment of the invention. The planarizing pad 240 can include a backing layer 242 that supports a planarizing pad body 241 having a plurality of abrasive elements 243. The planarizing pad 240 does not include an embedded chemical agent; instead, a chemical agent 246 is disposed directly in the planarizing liquid 260.

In one aspect of this embodiment, the chemical agent 246 directly restricts chemical interactions between the inhibiting agent and the abrasive particles 243 without first undergoing a chemical reaction with the planarizing liquid 260. Alternatively, the chemical agent 246 can first react with the planarizing liquid 260 to form an altered chemical agent that restricts interactions between the inhibiting agent and the abrasive particles 243, in a manner generally similar to that discussed above with reference to FIG. 2.

One feature of an embodiment of the planarizing medium 250 discussed above with reference to FIG. 3 is that the chemical agent 246 can be disposed directly in the planarizing liquid 260. Accordingly, the amount of chemical agent 246 in contact with the planarizing pad 240 and the microelectronic substrate 112 can be controlled by controlling the amount of chemical agent 246 mixed in the planarizing liquid 260. An advantage of this feature is that the amount of the chemical agent interacting with the polishing pad 140 can be controlled independently from the characteristics of the planarizing pad 140.

Figure 4:
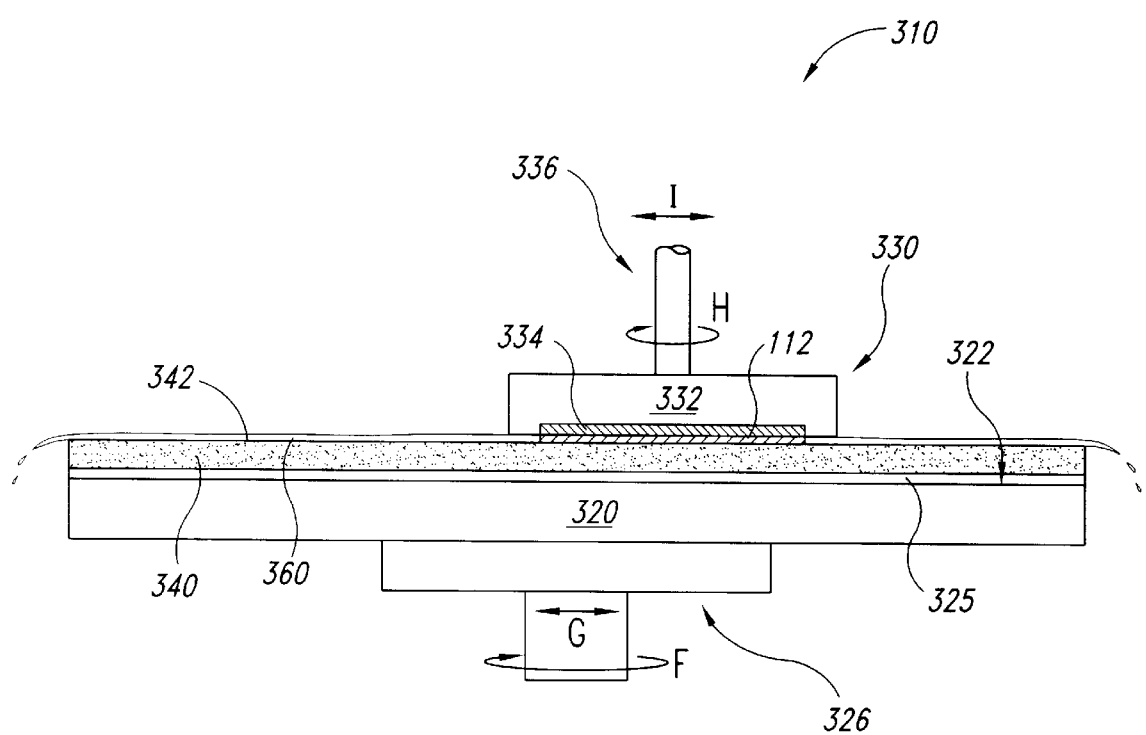
FIG. 4 is a partially schematic side elevational view of a polishing pad that supports a planarizing liquid on a CMP machine in accordance with another embodiment of the invention.

FIG. 4 is a partially schematic cross-sectional view of a rotary planarizing machine 310 with a generally circular platen or table 320, a carrier assembly 330, a planarizing pad 340 positioned on the table 320, and a planarizing liquid 360 on the planarizing pad 340. The compositions of planarizing pad 340 and the planarizing liquid 360 can be generally similar to the compositions of planarizing pads and planarizing liquids discussed above with reference to FIGS. 2 and 3. Alternatively, the planarizing liquid 360 can be a slurry having a suspension of abrasive elements, and the planarizing pad 340 can have no abrasive elements. The planarizing machine 310 may also have an under-pad 325 attached to an upper surface 322 of the platen 320 for supporting the planarizing pad 340. A drive assembly 326 rotates (arrow "F") and/or reciprocates (arrow "G") the platen 320 to move the planarizing pad 340 during planarization.

The carrier assembly 330 controls and protects the microelectronic substrate 112 during planarization. The carrier assembly 330 typically has a substrate holder 332 with a pad 334 that holds the microelectronic substrate 112 via suction. A drive assembly 336 of the carrier assembly 330 typically rotates and/or translates the substrate holder 332 (arrows "H" and "I," respectively). Alternatively, the substrate holder 332 may include a weighted, free-floating disk (not shown) that slides over the planarizing pad 340.

To planarize the microelectronic substrate 112 with the planarizing machine 310, the carrier assembly 330 presses the microelectronic substrate 112 against a planarizing surface 342 of the planarizing pad 340. The platen 320 and/or the substrate holder 332 then move relative to one another to translate the microelectronic substrate 112 across the planarizing surface 342. As a result, the abrasive particles in the planarizing pad 340 and/or the chemicals in the planarizing liquid 360 remove material from the surface of the microelectronic substrate 112.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for planarizing a microelectronic substrate, comprising:
   engaging the microelectronic substrate with a planarizing medium having a planarizing liquid and a planarizing pad with a planarizing surface, at least one of the planarizing liquid and the planarizing pad having a selected chemical agent;
   separating a passivating agent from a discrete element of the planarizing medium with the selected chemical agent, or impeding the passivating agent from coupling to the discrete element of the planarizing medium with the selected chemical agent, or both separating and impeding the passivating agent; and
   moving at least one of the planarizing pad and the microelectronic substrate relative to the other to remove material from the microelectronic substrate.

2. The method of claim 1, further comprising selecting the passivating agent to include a corrosion-inhibiting agent.

3. The method of claim 1 wherein separating or impeding or both separating and impeding the passivating agent includes chemically reacting the passivating agent with the selected chemical agent and dissolving the passivating agent in the planarizing liquid.

4. The method of claim 1 wherein separating or impeding or both separating and impeding the passivating agent includes chemically reacting the passivating agent with the selected chemical agent, breaking the passivating agent into constituents, and dissolving the constituents in the planarizing liquid.

5. The method of claim 1 wherein the planarizing pad includes abrasive elements fixedly dispersed therein and separating or impeding or both separating and impeding the passivating agent includes separating the passivating agent from the abrasive elements and/or restricting the passivating agent from attaching to the abrasive elements.

6. The method of claim 1, further comprising reacting the selected chemical agent with at least one constituent of the planarizing liquid to form an altered chemical agent and reacting the altered chemical agent with the passivating agent.

7. The method of claim 1, further comprising selecting the selected chemical agent to include phosphoric acid.

8. The method of claim 1 wherein the passivating agent includes benzoltriazole and separating or impeding or both separating and impeding the passivating agent includes chemically reacting the benzoltriazole with the selected chemical agent and dissolving the benzoltriazole in the planarizing liquid.

9. The method of claim 1, firther comprising selecting the selected chemical agent to include an etchant.

10. The method of claim 1 wherein the planarizing pad includes an abrasive element having a first zeta potential and the microelectronic substrate includes a constituent having a second zeta potential, further comprising selecting the planarizing liquid to have a pH such that both the inhibiting agent and the abrasive element have a charge with a similar polarity at that pH such that both the inhibiting agent and the abrasive element have a charge with a similar polarity at that pH.

11. The method of claim 1, further comprising selecting the planarizing liquid to have a pH of from about 6 to about 10.

12. The method of claim 1, further comprising selecting the planarizing liquid to have a pH of about 7.

13. A method for planarizing a microelectronic substrate, comprising:

engaging the microelectronic substrate with a planarizing surface of a planarizing pad and moving at least one of the planarizing pad and the microelectronic substrate relative to the other to remove material from the microelectronic substrate;

removing material from the planarizing pad as the one of the microelectronic substrate and the planarizing pad moves relative to the other to release a chemical agent from the planarizing pad; and separating a corrosion-inhibiting agent from a discrete element of the planarizing pad with the chemical agent, or impeding the corrosion-inhibiting agent from coupling to the discrete element of the planarizing pad with the chemical agent, or both separating and impeding the corrosion-inhibiting agent.

14. The method of claim 13 wherein removing material from the planarizing pad includes abrading the material from the planarizing surface of the planarizing pad.

15. The method of claim 13, further comprising reacting the chemical agent with a constituent of the planarizing liquid to form an altered chemical agent, further wherein separating or impeding or both separating and impeding the corrosion-inhibiting agent includes reacting the corrosion-inhibiting agent with the altered chemical agent.

16. The method of claim 13 wherein separating or impeding or both separating and impeding the corrosion-inhibiting agent includes chemically reacting the corrosion-inhibiting agent with the selected chemical agent and dissolving the corrosion-inhibiting agent in the planarizing liquid.

17. The method of claim 13 wherein separating or impeding or both separating and impeding the corrosion-inhibiting agent includes chemically reacting the corrosion-inhibiting agent with the selected chemical agent, breaking the corrosion-inhibiting agent into constituents, and dissolving the constituents in the planarizing liquid.

18. The method of claim 13, further comprising selecting the chemical agent to include phosphoric acid.

19. The method of claim 13 wherein the corrosion-inhibiting agent includes benzoltriazole and separating or impeding or both separating and impeding the corrosion-inhibiting agent includes chemically reacting the benzoltriazole with the selected chemical agent and dissolving the benzoltriazole in the planarizing liquid.

20. The method of claim 13, further comprising selecting the chemical agent to include an etchant.

21. The method of claim 13 wherein the planarizing pad includes abrasive elements fixedly dispersed therein and separating or impeding or both separating and impeding the corrosion-inhibiting agent includes separating the corrosion-inhibiting agent from the abrasive elements or restricting the corrosion-inhibiting agent from attaching to the abrasive elements or both.

22. A method for planarizing a microelectronic substrate, comprising:

engaging the microelectronic substrate with a planarizing surface of a planarizing pad and moving at least one of the planarizing pad and the microelectronic substrate relative to the other to remove material from the microelectronic substrate;

releasing a first chemical agent embedded in the planarizing pad proximate to the planarizing surface by removing material from the planarizing pad as the one of the microelectronic substrate and the planarizing pad moves relative to the other;

chemically transforming the first chemical agent into a second chemical agent in a chemical reaction external to the planarizing pad; and restricting an amount of corrosion-inhibiting agent chemically interacting with the planarizing pad by exposing the planarizing pad to the second chemical agent.

23. The method of claim 22 wherein restricting the amount of corrosion-inhibiting agent includes removing the corrosion-inhibiting agent from the planarizing pad with the second chemical agent.

24. The method of claim 22 wherein restricting an amount of corrosion-inhibiting agent includes preventing the corrosion-inhibiting agent from coupling to the planarizing pad.

25. The method of claim 22, further comprising selecting the first chemical agent to include at least one of phosphorus, chlorine, sulfur and nitrogen.

26. The method of claim 22, further comprising selecting the first chemical agent to produce a second chemical agent that includes at least one of phosphoric acid, hydrochloric acid, sulfuric acid and nitric acid.

27. The method of claim 22 wherein chemically transforming the first chemical agent includes combining the first chemical agent with a constituent of the planarizing liquid.

28. The method of claim 22 wherein the planarizing liquid includes water and chemically transforming the first chemical agent includes combining the first chemical agent with the water to form the second chemical agent.

29. The method of claim 22 wherein removing material from the planarizing pad includes abrading the material from the planarizing surface of the planarizing pad.

30. The method of claim 22 wherein restricting the corrosion-inhibiting agent includes chemically reacting the corrosion-inhibiting agent with the second chemical agent and dissolving the corrosion-inhibiting agent in the planarizing liquid.

31. The method of claim 22 wherein the planarizing pad includes abrasive elements fixedly dispersed therein and restricting the corrosion-inhibiting agent includes separating the corrosion-inhibiting agent from the abrasive elements or restricting the corrosion-inhibiting agent from coupling to the abrasive elements or both separating and restricting the corrosion-inhibiting agent.

32. A method for planarizing a microelectronic substrate, comprising:

engaging the microelectronic substrate with a planarizing liquid and a planarizing surface of a planarizing pad having a first chemical agent embedded therein;

moving at least one of the microelectronic substrate and the planarizing pad relative to the other to remove material from the microelectronic substrate;

releasing the first chemical agent into the planarizing liquid by removing material from the planarizing pad and exposing the first chemical agent to the planarizing liquid;

chemically reacting the first chemical agent with the planarizing liquid to form a second chemical agent chemically different than the first chemical agent; and controlling a rate, or a manner or both a rate and manner of material removal from the microelectronic substrate by chemically affecting the planarizing pad with the second chemical agent.

33. The method of claim 32 wherein controlling a rate, or a manner or both a rate and manner of material removal includes restricting an amount of a corrosion-inhibiting agent chemically interacting with the planarizing pad by chemically combining the corrosion-inhibiting agent with the second chemical agent.

34. The method of claim 32 wherein the second chemical agent includes an etchant and controlling a rate, or a manner or both a rate and manner of material removal includes accelerating a removal rate of material from the microelectronic substrate by exposing the microelectronic substrate to the etchant.

35. The method of claim 32, further comprising selecting the first chemical agent to include at least one of phosphorus, chlorine, sulfur and nitrogen.

36. The method of claim 32, further comprising selecting the first chemical agent to produce a second chemical agent that includes at least one of phosphoric acid, hydrochloric acid, sulfuric acid and nitric acid.

37. The method of claim 32 wherein chemically reacting the first chemical agent includes combining the first chemical agent with a constituent of the planarizing liquid.

38. The method of claim 32 wherein the planarizing liquid includes water and chemically reacting the first chemical agent includes combining the first chemical agent with the water to form the second chemical agent.

39. The method of claim 32 wherein removing material from the planarizing pad includes abrading the material from the planarizing surface of the planarizing pad.

40. A planarizing medium for planarizing a microelectronic substrate, comprising:

a planarizing pad having a planarizing surface configured to engage the microelectronic substrate; and a planarizing liquid adjacent to the planarizing pad, at least one of the planarizing pad and the planarizing liquid having discrete elements and a chemical agent selected to separate a passivating agent from the discrete elements, or impede the passivating agent from attaching to the discrete elements during planarization of the microelectronic substrate or both separate and impede the passivating agent.

41. The planarizing medium of claim 40 wherein the chemical agent is selected to include a corrosion-inhibiting agent.

42. The planarizing medium of claim 40 wherein the chemical agent is selected to dissolve the passivating agent in the planarizing liquid.

43. The planarizing medium of claim 40 wherein the chemical agent is selected to break the passivating agent into constituents that are soluble in the planarizing liquid.

44. The planarizing medium of claim 40 wherein the chemical agent includes phosphoric acid.

45. The planarizing medium of claim 40 wherein the chemical agent includes an etchant.

46. The planarizing medium of claim 40, wherein the discrete elements include abrasive elements fixedly dispersed in the planarizing pad, further wherein the chemical agent is selected to separate the passivating agent from the abrasive elements, or restrict the passivating agent from coupling to the abrasive elements or both separate and restrict the passivating agent.

47. The planarizing medium of claim 40 wherein the chemical agent is selected to react with a constituent of the planarizing liquid to form an altered chemical agent that separates the passivating agent from the abrasive elements, or restricts the passivating agent from attaching to the abrasive elements or both separates and restricts the passivating agent.

48. The planarizing medium of claim 40, further comprising the planarizing liquid, the planarizing liquid having a pH of from about 6 to about 10.

49. The planarizing medium of claim 40, further comprising the planarizing liquid, the planarizing liquid having a pH of about 7.

50. The planarizing medium of claim 40 wherein the planarizing pad includes an abrasive element having a first zeta potential and the microelectronic substrate includes a constituent having a second zeta potential, the planarizing liquid having a pH such that both the inhibiting agent and the abrasive element have a charge with a similar polarity.

51. A planarizing medium for planarizing a microelectronic substrate, comprising:

a planarizing pad body having a planarizing surface configured to engage the microelectronic substrate, the planarizing pad body including a planarizing pad material that erodes during planarization of the microelectronic substrate; and a first chemical agent embedded in the planarizing pad body proximate to the planarizing surface, the first chemical agent being selected to undergo a chemical reaction with a planarizing liquid to form a second chemical agent different than the first chemical agent when erosion of the planarizing pad body exposes the first chemical agent to the planarizing liquid, the second chemical agent being selected to control a manner of material removal from the microelectronic substrate by affecting chemical properties of the planarizing pad body.

52. The planarizing medium of claim 51 wherein the second chemical agent is selected to restrict an amount of a corrosion-inhibiting agent chemically interacting with the planarizing pad by chemically combining the corrosion-inhibiting agent with the second chemical agent.

53. The planarizing medium of claim 51 wherein the second chemical agent is selected to include an etchant for accelerating a removal rate of material from the microelectronic substrate.

54. The planarizing medium of claim 51 wherein the first chemical agent is selected to include at least one of phosphorus, chlorine, sulfur and nitrogen.

55. The planarizing medium of claim 51 wherein the first chemical agent is selected to produce a second chemical agent that includes at least one of phosphoric acid, hydrochloric acid, sulfuric acid and nitric acid.

56. A planarizing medium for planarizing a microelectronic substrate, comprising:

a planarizing pad having a planarizing surface configured to engage the microelectronic substrate, the planarizing pad including a planarizing pad material that erodes during planarization of the microelectronic substrate; and a chemical agent embedded in the planarizing pad proximate to the planarizing surface, the chemical agent being released when erosion of the planarizing pad exposes the chemical agent, the chemical agent being selected to separate a corrosion-inhibiting agent from discrete elements of the planarizing pad, or impede the corrosion-inhibiting agent from coupling to the discrete elements of the planarizing pad during planarization of the microelectronic substrate, or both separate and impede the corrosion-inhibiting agent.

57. The planarizing medium of claim 56 wherein the chemical agent includes an etchant.

58. The planarizing medium of claim 56 wherein the chemical agent includes phosphoric acid.

59. The planarizing medium of claim 56 wherein the chemical agent is a first chemical agent and is selected to undergo a chemical reaction upon being released from the planarizing pad to form a second chemical agent configured to remove a corrosion-inhibiting agent from the planarizing pad, or prevent the corrosion-inhibiting agent from coupling to the planarizing pad during planarization of the microelectronic substrate, or both remove and prevent the corrosion-inhibiting agent.

60. A planarizing medium for planarizing a microelectronic substrate, comprising:

a planarizing pad body having a planarizing surface configured to engage the microelectronic substrate, the planarizing pad body including a planarizing pad material that erodes during planarization of the microelectronic substrate; and a first chemical agent embedded in the planarizing pad body proximate to the planarizing surface, the first chemical agent being selected to undergo a chemical reaction with a planarizing liquid to form a second chemical agent when erosion of the planarizing pad body exposes the first chemical agent to the planarizing liquid, the second chemical agent being selected to at least restrict an inhibiting agent from chemically interacting with the planarizing pad body during planarization of the microelectronic substrate.

61. The planarizing medium of claim 60 wherein the inhibiting agent includes benzoltriazole and the second chemical agent is selected to restrict the benzoltriazole from coupling to the planarizing surface of the planarizing pad body.

62. The planarizing medium of claim 60, further comprising abrasive elements fixedly dispersed in the planarizing pad body, the second chemical agent being selected to at least restrict an inhibiting agent from chemically interacting with the abrasive elements during planarization of the microelectronic substrate.

63. The planarizing medium of claim 62 wherein the abrasive elements include alumina particles.

64. The planarizing medium of claim 60 wherein the microelectronic substrate includes copper, the inhibiting agent is selected to inhibit corrosion of the copper, and the second chemical agent is selected to remove the inhibiting agent from the planarizing pad.

65. The planarizing medium of claim 60 wherein the first chemical agent is selected from chlorine, phosphorus, sulfur and nitrogen.

66. The planarizing medium of claim 60 wherein the first chemical agent is selected to form a second chemical agent that includes at least one of hydrochloric acid, phosphoric acid, sulfuric acid and nitric acid.

* * * * *